(12) United States Patent
Park et al.

(10) Patent No.: US 9,947,732 B2
(45) Date of Patent: Apr. 17, 2018

(54) ORGANIC LIGHT EMITTING DIODE DISPLAY DEVICE

(71) Applicant: LG Display Co., Ltd., Seoul (KR)

(72) Inventors: Hong-Ki Park, Goyang-si (KR); Hyo-Dae Bae, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/183,727

(22) Filed: Jun. 15, 2016

(65) Prior Publication Data
US 2017/0005149 A1 Jan. 5, 2017

(30) Foreign Application Priority Data
Jun. 30, 2015 (KR) .................. 10-2015-0093651

(51) Int. Cl.
| H01L 27/32 | (2006.01) |
| H01L 51/00 | (2006.01) |
| H01L 51/56 | (2006.01) |
| H01L 27/12 | (2006.01) |
| H01L 51/50 | (2006.01) |

(52) U.S. Cl.
CPC ...... *H01L 27/3246* (2013.01); *H01L 27/3262* (2013.01); *H01L 51/0004* (2013.01); *H01L 51/56* (2013.01); *H01L 27/1214* (2013.01); *H01L 51/5012* (2013.01)

(58) Field of Classification Search
CPC . H01L 27/32; H01L 27/3246; H01L 27/3262; H01L 51/0004; H01L 51/56
See application file for complete search history.

(56) References Cited

U.S. PATENT DOCUMENTS

| 2005/0116632 | A1 | 6/2005 | Funamoto et al. | |
| 2007/0035242 | A1 | 2/2007 | Lee et al. | |
| 2009/0026467 | A1 | 1/2009 | Yanagihara | |
| 2013/0082288 | A1* | 4/2013 | Kim | H01L 27/3213 257/89 |
| 2013/0105782 | A1* | 5/2013 | Matsushima | H01L 27/3246 257/40 |
| 2014/0145157 | A1* | 5/2014 | Kim | H01L 27/32 257/40 |
| 2014/0145158 | A1 | 5/2014 | Choi et al. | |
| 2015/0001486 | A1 | 1/2015 | Kim et al. | |

OTHER PUBLICATIONS

European Patent Office, Extended European Search Report and Opinion, EP Patent Application No. 16177099.5, Oct. 28, 2016, five pages.

* cited by examiner

*Primary Examiner* — Phuc Dang
(74) *Attorney, Agent, or Firm* — Fenwick & West LLP

(57) ABSTRACT

Disclosed is an organic light emitting diode (OLED) display device including a substrate including a pixel region and a boundary region outside the pixel region. The pixel region comprises an area having a short side and a long side. The pixel region comprises an array of pixels to emit light. The OLED display device includes a substrate in the pixel region and in the boundary region The OLED display device further includes a first electrode of a light emitting device in the pixel region over the substrate, a first bank covering edges of the first electrode in the pixel region on the substrate in the boundary region, wherein a width of an edge of the first bank along the short side of the pixel region is different from a width of an edge of the first bank along the long side of the pixel region, and a second bank on a portion of the first bank in the boundary region.

22 Claims, 4 Drawing Sheets

ORGANIC LIGHT EMITTING DIODE DISPLAY DEVICE

The present application claims the priority benefit of Korean Patent Application No. 10-2015-0093651 filed in Republic of Korea on Jun. 30, 2015, which is hereby incorporated by reference in its entirety for all purposes as if fully set forth herein.

BACKGROUND OF THE INVENTION

Field of the Invention

The present invention relates to an organic light emitting diode (OLED) display device. In particular, the present invention relates to an OLED display device that has improved uniformity of thickness of an organic light emitting layer.

Discussion of the Related Art

Recently, flat display devices, such as a plasma display panel (PDP), a liquid crystal display (LCD) device, and an organic light emitting diode (OLED) display device, have been researched.

Among the flat display devices, the OLED display device is a self-luminescent device and can have a thin profile because the OLED display device does not need a backlight used for the LCD device.

Further, compared with the LCD device, the OLED display device has advantages of excellent viewing angle and contrast ratio, low power consumption, operation in low DC voltage, fast response speed, being strong to an external impact because of its solid internal components, and wide operating temperature range.

Particularly, since processes of manufacturing the OLED display device are simple, production cost of the OLED display device can be reduced more that that of the LCD device.

FIG. 1 is a plan view illustrating an OLED display device according to the related art.

As shown in FIG. 1, the related art OLED display device includes a plurality of pixel regions P, a first bank 30a and 30b separating the pixel regions P and located at a boundary portion of each pixel region P, and a second bank 50a and 50b exposing edges of the first bank 30a and 30b and located on the first bank 30a and 30b.

The first bank 30a and 30b is divided into a first portion 30a along a long side of the pixel region P and a second portion 30b along a short side of the pixel region P, and the second bank 50a and 50b is divided into a third portion 50a along the long side of the pixel region P and a fourth portion 50b along the short side of the pixel region P.

A width of the edge of the first portion 30a is equal to that of the second portion 30b.

FIG. 2 is a cross-sectional view taken along a line II-II of FIG. 1, and FIG. 3 is a cross-sectional view taken along a line of FIG. 1. In more detail, FIG. 2 is a cross-sectional view of the pixel region P and the boundary portion thereof along a minor axis of the pixel region, and FIG. 3 is a cross-sectional view of the pixel region P and the boundary portion thereof along a major axis of the pixel region.

As shown in FIGS. 2 and 3, the related art OLED display device includes a first electrode 20 in the pixel region P on a substrate 11, the first bank 30a and 30b at the boundary portion of the pixel region P on the substrate 11, the second bank 50a and 50b on the first bank 30a and 30b, and an organic light emitting layer 70 on the first electrode 20.

The first bank 30a and 30b is arranged to cover edges of the first electrode 20, and the second bank 50a and 50b is arranged to expose the edges of the first bank 30a and 30b.

A width w1 of an edge e1 of the first portion 30a is equal to a width w2 of an edge e2 of the second portion 30b.

For example, the width w1 of the edge e1 of the first portion 30a and the width w2 of the edge e2 of the second portion 30b may be equally 1 um to 10 um.

Further, a height h1 of the third portion 50a is equal to a height h2 of the fourth portion 50b.

For example, the height h1 of the third portion 50a and the height h2 of the fourth portion 50b may be equally 1 um to 10 um.

The first electrode 20 may be made of a transparent conductive material having a relatively greater work function to function as an anode. The first bank 30a and 30b may be made of an inorganic material having a hydrophilicity, and the second bank 50a and 50b may be made of an organic material having a hydrophobicity.

The OLED display device further includes a driving thin film transistor DTr located between the substrate 11 and the first electrode 20 and connected to the first electrode 20.

The organic light emitting layer 70 is laminated using a soluble process such as an inkjet printing method, a nozzle printing method or the like.

In detail, the organic light emitting layer 70 is formed by dropping an organic light emitting material solution on the first electrode 20 and then drying the organic light emitting material solution.

A phenomenon occurs that a thickness of an edge portion of the organic light emitting layer 70 is greater than a thickness of a center portion of the organic light emitting layer 70 in the drying process. This phenomenon is referred to as a pile-up phenomenon.

In this case, since the edges e1 and e2 of the first bank 30a and 30b is exposed by the second bank 50a and 50b, the dropped organic light emitting material solution contacts top surfaces of the edges e1 and e2 of the first bank 30a and 30b.

Further, since the first bank 30a and 30b is made of an hydrophilic inorganic material, the first bank 30a and 30b has a surface energy greater than that of the second bank 50a and 50b, and a surface tension of the organic light emitting material solution at the top surfaces of the edges e1 and e2 of the first bank 30a and 30b is reduced.

Accordingly, the pile-up phenomenon is induced from the top surfaces of the edges e1 and e2 of the first bank 30a and 30b to side walls of the second bank 50a and 50b.

Thus, the pile-up phenomenon at the boundary portion of a display region out of the pixel region P the can be relieved to some extent.

In other words, a uniformity of thickness of the display region of the pixel region P can be improved to some extent.

However, since the pile-up phenomenon at the boundary portion is not completely improved, a ununiformity of brightness still occurs due to reduction of a uniformity of thickness of the organic light emitting layer 70 and light emission efficiency and lifetime of the OLED display device are reduced.

Further, since the dual banks of the first bank 30a and 30b and the second bank 50a and 50b are arranged vertically, an aperture ratio of the OLED display device is reduced compared with the LCD device.

SUMMARY OF THE INVENTION

Accordingly, the present invention is directed to an OLED display device that substantially obviates one or more of the problems due to limitations and disadvantages of the related art.

An object of the present invention is to improve a uniformity of thickness of an organic light emitting layer and a ununiformity of brightness.

Additional features and advantages of the disclosure will be set forth in the description which follows, and in part will be apparent from the description, or may be learned by practice of the disclosure. The advantages of the disclosure will be realized and attained by the structure particularly pointed out in the written description and claims as well as the appended drawings.

To achieve these and other advantages, and in accordance with the purpose of the present invention, as embodied and broadly described herein, an organic light emitting diode (OLED) display device includes pixel region and a boundary region outside the pixel region. The pixel region comprises an area having a short side and a long side. The pixel region comprises an array of pixels to emit light. The OLED display device includes a substrate in the pixel region and in the boundary region, a first electrode of a light emitting device in the pixel region over the substrate, a first bank covering edges of the first electrode in the pixel region on the substrate in the boundary region, and a second bank on a portion of the first bank in the boundary region, wherein a width of an edge of the first bank along the short side of the pixel region is different from a width of an edge of the first bank along the long side of the pixel region.

In another embodiment, an organic light emitting display (OLED) device includes a pixel region and a boundary region outside the pixel region. The pixel region comprises an area having a short dimension and a long dimension. The pixel region comprises an array of pixels to emit light. A substrate is in the pixel region and in the boundary region. An electrode is on the substrate in the pixel region. The electrode has long edge portions oriented along the long dimension of the pixel region and the electrode has short edge portions oriented along the short dimension of the pixel region. A first bank is on the substrate in the boundary region and on the long and the short edge portions of the electrode in the pixel region. A second bank is on the first bank in the boundary region. The second bank has long edge portions oriented along the long dimension of the pixel region and short edge portions oriented along the short dimension of the pixel region. An organic light emitting layer is on the electrode and on the first bank in the pixel region and on at least a portion of the second bank in the boundary region. An average height of short edge portions of the organic light emitting layer on the second bank is greater than an average height of long edge portions of the organic light emitting layer on the second bank.

In another embodiment, a display device comprises a plurality of pixel regions each comprising an area having a short dimension and a long dimension. Each of the pixel regions comprises an array of pixels to emit light. A plurality of boundary regions separates the pixel regions. The boundary regions comprise a first bank and a second bank. The first comprises a hydrophilic material around a perimeter of the pixel region. A second bank comprising a hydrophobic material on a portion of the first bank around the perimeter of the pixel region. The second bank has long edge portions along the long dimension and short edge portions along the short dimension. A first height of the short edge portions of the second bank is greater than a second height of the long edge portions of the second bank.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the disclosure and are incorporated in and constitute a part of this specification, illustrate embodiments of the disclosure and together with the description serve to explain the principles of the disclosure. In the drawings.

DETAILED DESCRIPTION OF THE ILLUSTRATED EMBODIMENTS

Reference will now be made in detail to embodiments, examples of which are illustrated in the accompanying drawings. The same or like reference numbers may be used throughout the drawings to refer to the same or like parts.

Figure 1:
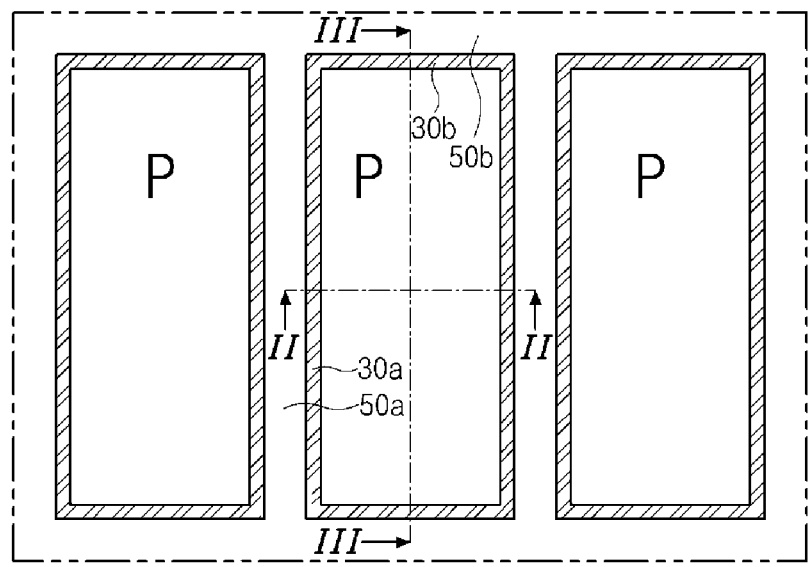
FIG. 1 is a plan view illustrating an OLED display device according to the related art.
Figure 2:
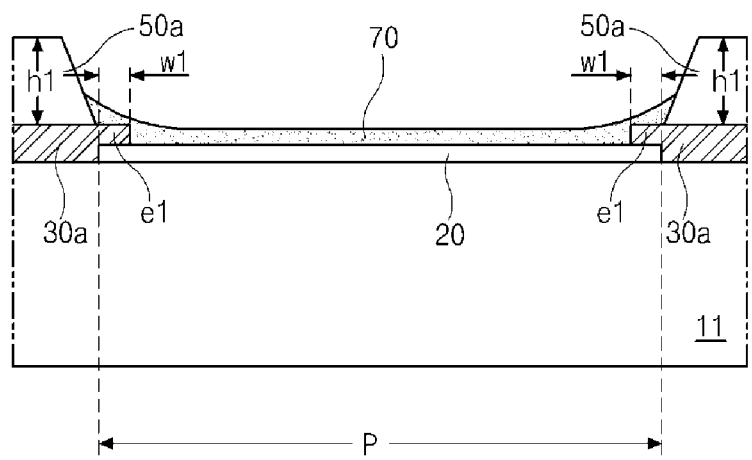
FIG. 2 is a cross-sectional view taken along a line II-II of FIG. 1.
Figure 3:
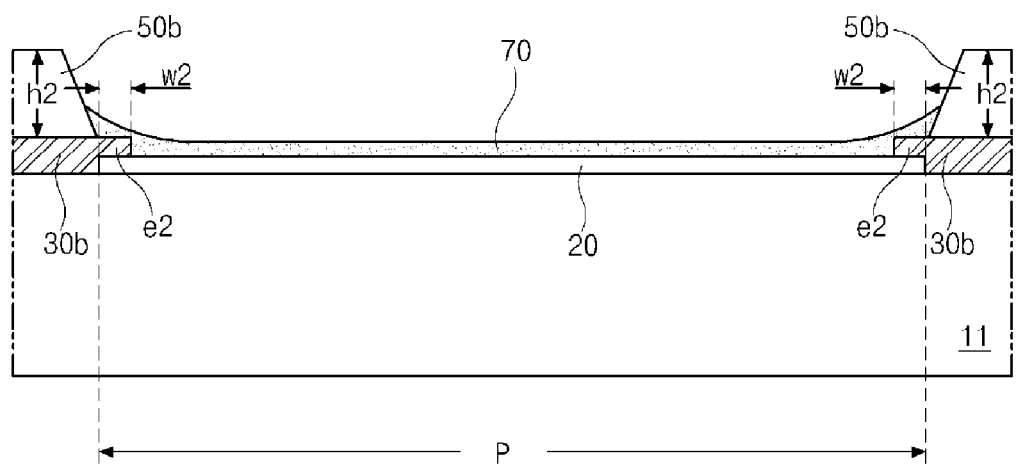
FIG. 3 is a cross-sectional view taken along a line III-III of FIG. 1.
Figure 4:
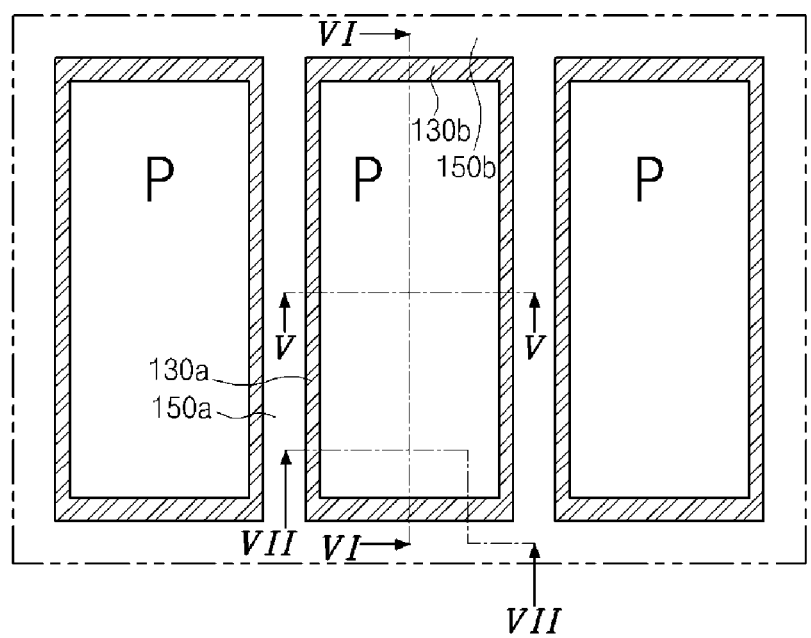
FIG. 4 is a plan view illustrating an OLED display device according to an embodiment of the present invention.

FIG. 4 is a plan view illustrating an OLED display device according to an embodiment of the present invention.

As shown in FIG. 4, the OLED display device of the embodiment includes a plurality of pixel regions P, a first bank 130a and 130b in a boundary region separating the pixel regions P and located at a boundary portion of each pixel region P, and a second bank 150a and 150b in the boundary region not covering (e.g., exposing) edges of the first bank 130a and 130b and located on the first bank 130a and 130b. The edges of the first bank 130a and 130b not covered by the second bank 150a and 150b may be covered by a different layer, such as organic light emitting layer as described below. The first bank 130a and 130b and second bank 150a and 150b may be located around a perimeter of the pixel region P.

The first bank 130a and 130b is divided into a first portion 130a (e.g., a long edge portion) along a long side of the pixel region P and a second portion 130b (e.g., a short edge portion) along a short side of the pixel region P, and the second bank 150a and 150b is divided into a third portion 150a (e.g., a long edge portion) along the long side of the pixel region P and a fourth portion 150b (e.g., a short edge portion) along the short side of the pixel region P.

A width of the edge of the second portion 130b is greater than that of the first portion 130a.

Figure 5:
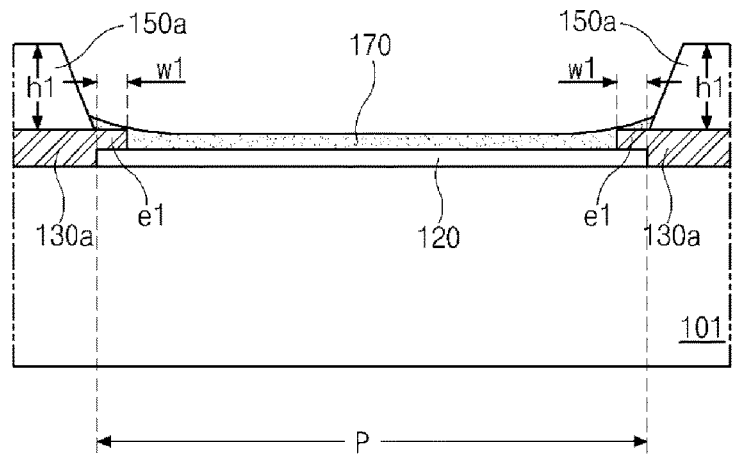
FIG. 5 is a cross-sectional view taken along a line V-V of FIG. 4.
Figure 6:
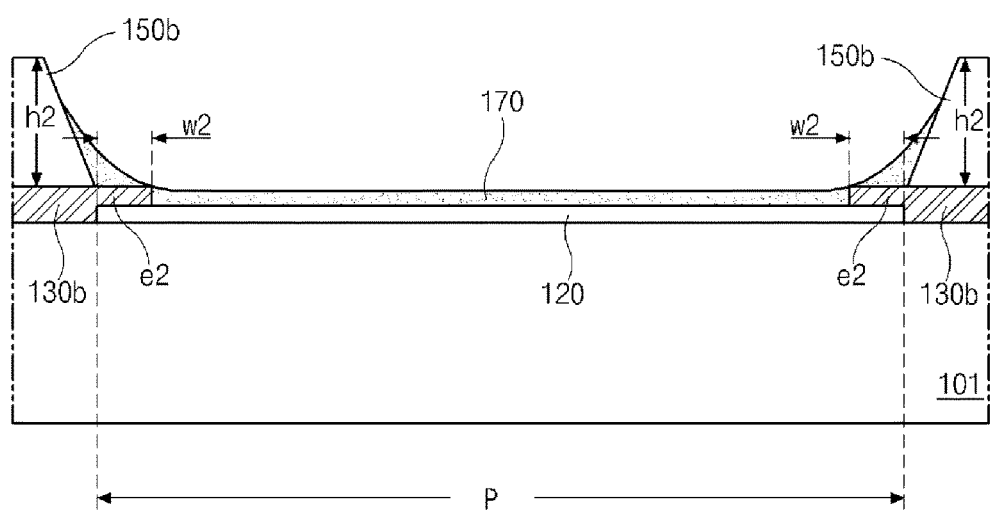
FIG. 6 is a cross-sectional view taken along a line VI-VI of FIG. 4.
Figure 7:
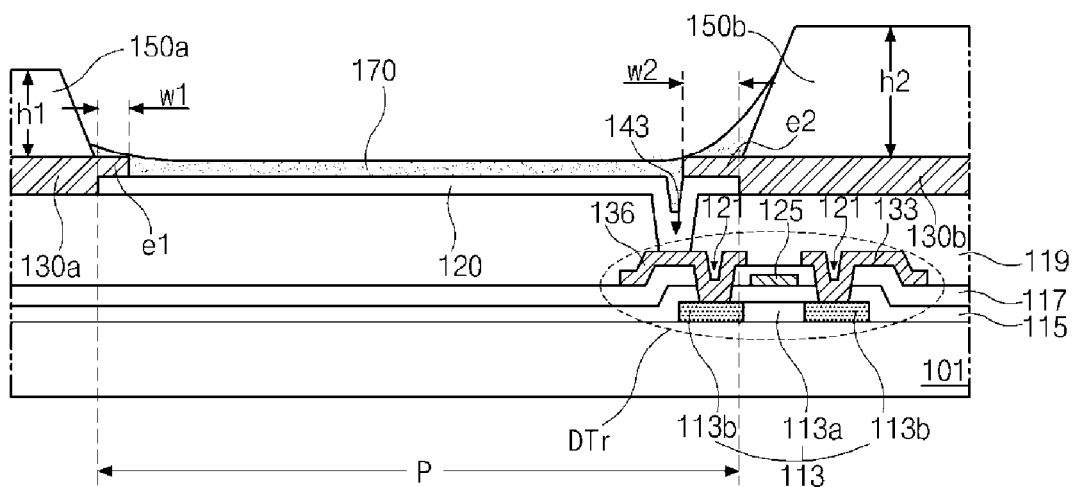
FIG. 7 is a cross-sectional view taken along a line VII-VII of FIG. 4.

FIG. 5 is a cross-sectional view taken along a line V-V of FIG. 4, FIG. 6 is a cross-sectional view taken along a line VI-VI of FIG. 4, and FIG. 7 is a cross-sectional view taken along a line VII-VII of FIG. 4. In more detail, FIG. 5 is a cross-sectional view of the pixel region P and the boundary portion thereof along a minor axis of the pixel region, FIG. 6 is a cross-sectional view of the pixel region P and the boundary portion thereof along a major axis of the pixel region, and FIG. 7 is a cross-sectional view of the pixel region P and the boundary portion thereof with a driving thin film transistor.

As shown in FIGS. 5-7, the OLED display device of the embodiment includes a first electrode 120 on or over the substrate 101 in the pixel region P and in a boundary region separating the pixel regions P, the first bank 130a and 130b covering edges of the first electrode 120 in the pixel region P and on the substrate 101 in a boundary region surrounding the pixel region P, the second bank 150a and 150b on a portion of the first bank 130a and 130b in the boundary region, and an organic light emitting layer 170 on the first electrode 120 and on the first bank 130a and 130b in the pixel region and on at least a portion of the second bank in the boundary region.

The first bank 130a and 130b is arranged to cover edges of the first electrode 120, and the second bank 150a and 150b is arranged to not cover the edges e1 and e2 of the first bank 130a and 130b (which may be covered by a different layer such as the organic light emitting layer 170).

A width w1 of the edge e1 of the first portion 130a is different from a width w2 of the edge e2 of the second portion 130b.

In detail, the width w2 of the edge e2 of the second portion 130b is greater than the width w1 of the edge e1 of the first portion 130a.

For example, the width w2 of the edge e2 of the second portion 130b may be about 7.5 um to about 10 um, and the width w1 of the edge e1 of the first portion 130b may be about 5 um. In other example, the width w2 of the edge e2 of the second portion 130b may be about 6 um to about 8 um, and the width w1 of the edge e1 of the first portion 130b may be about 4 um. In other example, the width w2 of the edge e2 of the second portion 130b may be about 4.5 um to about 6 um, and the width w1 of the edge e1 of the first portion 130b may be about 3 um. Thus, in one embodiment, the width w2 may be in the range of 1.5-2 times the width w1.

Further, a height h1 of the third portion 150a is different from a height h2 of the fourth portion 150b.

In detail, the height h2 of the fourth portion 150b is greater than the height h1 of the third portion 150a.

For example, the height h2 of the fourth portion 150b may be about 1.5 um to 2 um, and the height h1 of the third portion 150a may be about 1 um. In other example, the height h2 of the fourth portion 150b may be about 2.5 um to 3 um, and the height h1 of the third portion 150a may be about 2 um. Thus, for example, the height h2 may be in the range of 1.25-2 times the height h1. Further, in an embodiment, the height h2 of the fourth portion 150b may be higher than the height h1 of the third portion 150a at least by 0.5 um, and the height of h2 of the fourth portion 150b may be 3 um or less.

In this case, using a half-tone mask or the like including a blocking region, a semi-transmissive region and a transmissive region, the heights h1 and h2 of the second bank 150a and 150b may be formed differently.

Accordingly, the second bank 150a and 150b having the different heights h1 and h2 can be formed, and thus production process can be simplified.

The first electrode 120 may be made of a transparent conductive material, for example, indium-tin-oxide (ITO) or indium-zinc-oxide (IZO), having a relatively greater work function to function as an anode.

The first bank 130a and 130b may be made of an inorganic material, for example, silicon oxide ($SiO_2$) or silicon nitride ($SiN_x$), having a hydrophilicity. The second bank 150a and 150b may be made of an organic material, for example, polyacryl, polyimide, polyamide (PA), benzocyclobutene (BCB), or phenol resin, having a hydrophobicity.

The OLED display device further includes the driving thin film transistor DTr located between the substrate 101 and the first electrode 120 and connected to the first electrode 120.

The detailed structure of the driving thin film transistor DTr is explained with reference to FIG. 7.

A semiconductor layer 113 is located on the substrate 101 and includes a first region 113a made of intrinsic polysilicon, and a second region 113b located at each of both sides of the first region 113a and doped with highly concentrated impurities.

A gate insulating layer 115 is located entirely on the substrate 101 and covers the semiconductor layer 113. A gate electrode 125 is located on the gate insulating layer 115 corresponding to the first region 113a. An inter-layered insulating layer 117 covers the gate electrode 125 and is entirely on the substrate 101.

A semiconductor contact hole 121 exposing each second region 113b is formed in the gate insulating layer 115 and the inter-layered insulating layer 117.

Source and drain electrodes 133 and 136 are located on the inter-layered insulating layer 117, are connected to the respective second regions 113b through the respective semiconductor contact holes 121, and are spaced apart from each other.

The source and drain electrodes 133 and 136, the semiconductor layer 113, the gate electrode 125 form the driving thin film transistor DTr.

A passivation layer 119 is located on the driving thin film transistor DTr over the entire substrate 101, and has a planarization property.

A drain contact hole 143 exposing the drain electrode 136 is formed in the passivation layer 119. The drain electrode 136 is connected to the first electrode 120 through the drain contact hole 143.

The organic light emitting layer 170 is located on the first electrode 120. A second electrode (not shown) is located on the organic light emitting layer 170 and the second bank 150a and 150b.

The organic light emitting layer 170 is laminated using a soluble process such as an inkjet printing method, a nozzle printing method or the like.

The organic light emitting layer 170 is formed by dropping an organic light emitting material solution on the first electrode 120 and then drying the organic light emitting material solution.

A phenomenon occurs that a thickness of an edge portion of the organic light emitting layer 170 is greater than a thickness of a center portion of the organic light emitting layer 170 in the drying process. This phenomenon is referred to as a pile-up phenomenon.

In this case, since the edges e1 and e2 of the first bank 130a and 130b are exposed by the second bank 150a and 150b, the dropped organic light emitting material solution contacts top surfaces of the edges e1 and e2 of the first bank 130a and 130b.

Further, since the first bank 130a and 130b is made of an hydrophilic inorganic material, the first bank 130a and 130b has a surface energy greater than that of the second bank 150a and 150b, and a surface tension of the organic light emitting material solution at the top surfaces of the edges e1 and e2 of the first bank 130a and 130b is reduced.

Accordingly, the pile-up phenomenon is induced from the top surfaces of the edges e1 and e2 of the first bank 130a and 130b to side walls of the second bank 150a and 150b.

Further, as shown in the drawings, the width w2 of the edge e2 of the second portion 130b along the short side of the pixel region P is greater that the width w1 of the edge e1 of the first portion 130a along the long side of the pixel region P.

Accordingly, regarding areas that contact the dropped organic light emitting material solution, the area at the edge e2 of the second portion 130b is wider than the area at the edge d1 of the first portion 130a.

Further, as shown in the drawings, the height h2 of the fourth portion 150b along the short side of the pixel region P is greater the height h1 of the third portion 150a along the long side of the pixel region P.

Accordingly, in the drying process of the organic light emitting material solution, the pile-up phenomenon at the side wall of the fourth portion 150b occurs relatively more while the pile-up phenomenon at the side wall of the third portion 150a occurs relatively less. Thus, an average height of the organic light emitting layer along its short edge portions on the second bank is greater than an average height of the organic light emitting layer along the long edge portions on the second bank. Furthermore, due to the difference in pile-up phenomenon, a width of the organic light emitting layer along its short edge portions over the first bank is greater than a width of the organic light emitting layer along its long edge portions over the first bank.

Having greater pile-up phenomenon along the short edge portions beneficially acts to stretch the organic light emitting material and improves a uniformity of thickness of the display region across the pixel region P and results in the reduced pile-up along the long edge portions which forms part of the viewable display. Furthermore, the increased pile-up phenomenon along the short edge does not significantly affect the viewable display area because the area above the driving thin film transistor DTr along the short edge is not used for display or represents a less significant portion of the display, in one embodiment.

Thus, the OLED display device of the embodiment can prevent a ununiformity of brightness caused by reduction of a uniformity of thickness, and can improve light emission efficiency and lifetime of an organic light emitting diode.

Further, the driving thin film transistor DTr is arranged below the second portion 130b and the fourth portion 150b along the short side of the pixel region P.

In the drawings, it is shown that the driving thin film transistor DTr is arranged at the boundary portion of the lower side of the pixel region P. Alternatively, the driving thin film transistor DTr may be arranged at the boundary portion of the upper side of the pixel region P. Thus, for example, at least a portion of the driving thin film transistor DTr is under the edge of the first bank 130b along either one of the short sides in the pixel region P.

Accordingly, since the driving thin film transistor DTr is arranged below the second portion 130b and the fourth portion 150b along the short side of the pixel region P where the pile-up phenomenon occurs relatively more, an aperture ratio of the OLED display device can be improved.

Further, even though the dual banks of the first bank 130a and 130b and the second bank 150a and 150b are arranged vertically, by adjusting the widths w1 and w2 of the first and second portions 130a and 130b along the short side and the long side of the pixel region P, the aperture ratio of the OLED display device can be further improved.

In the above embodiment, it is described that, in order to improve a uniformity of thickness, the OLED display device is configured with the width w2 of the edge e2 of the second portion 130b being greater than the width w1 of the edge e1 of the first portion 130a and the height h2 of the fourth portion 150b being greater than the height h1 of the third portion 150a. In another embodiment, the OLED can be configured with either, but not necessarily both, the width w2 of the edge e2 of the second portion 130b being greater than the width w1 of the edge e1 of the first portion 130a or the height h2 of the fourth portion 150b being greater than the height h1 of the third portion 150a, and this configuration can improve a uniformity of thickness sufficiently. In other words, the widths w1 and w2 of the first bank and/or the heights h1 and h2 of the second bank can be dimensioned to improve a uniformity of thickness.

It will be apparent to those skilled in the art that various modifications and variations can be made in a display device of the present invention without departing from the spirit or scope of the disclosure. Thus, it is intended that the present invention covers the modifications and variations of this disclosure provided they come within the scope of the appended claims and their equivalents.

What is claimed is:

1. An organic light emitting diode (OLED) display device including a pixel region and a boundary region outside the pixel region, the pixel region comprising an area having a short side and a long side, the pixel region comprising an array of pixels to emit light, the OLED display device comprising:
   a substrate in the pixel region and in the boundary region;
   a first electrode of a light emitting device in the pixel region over the substrate;
   a first bank covering edges of the first electrode in the pixel region and on the substrate in the boundary region, wherein a width of an edge of the first bank along the short side of the pixel region is different from a width of an edge of the first bank along the long side of the pixel region; and
   a second bank on a portion of the first bank in the boundary region; and
   an organic light emitting layer on the first electrode and a portion of the first bank in the pixel region and contacting side walls of the second bank in the boundary region.

2. The OLED display device of claim 1, wherein a height of the second bank along the short side of the pixel region is different from a height of the second bank along the long side of the pixel region.

3. The OLED display device of claim 1, wherein the width of the edge of the first bank along the short side of the pixel region is greater than the width of the edge of the first bank along the long side of the pixel region.

4. The OLED display device of claim 1, wherein a height of the second bank along the short side of the pixel region is greater than a height of the second bank along the long side of the pixel region.

5. The OLED display device of claim 4, wherein the first bank comprises a hydrophilic inorganic material, and the second bank comprises a hydrophobic organic material.

6. The OLED display device of claim 1, further comprising a driving thin film transistor between the substrate and the first electrode and connected to the first electrode.

7. The OLED display device of claim 6, wherein at least a portion of the driving thin film transistor is under the edge of the first bank along the short side of the pixel region.

8. The OLED display device of claim 1, further comprising:
a second electrode on the organic light emitting layer and the second bank.

9. The OLED display device of claim 1, wherein the organic light emitting layer is laminated using a soluble process.

10. The OLED display device of claim 1, wherein the width of the edge of the first bank along the short side of the pixel region and the width of the edge of the first bank along the long side of the pixel region are dimensioned such that an average height of short edge portions of the organic light emitting layer on the second bank is greater than an average height of long edge portions of the organic light emitting layer on the second bank.

11. The OLED display device of claim 1, wherein a height of the second bank along the short side of the pixel region and a height of the second bank along the long side of the pixel region are dimensioned such that an average height of short edge portions of the organic light emitting layer on the second bank is greater than an average height of long edge portions of the organic light emitting layer on the second bank.

12. An organic light emitting diode (OLED) display device including a pixel region and a boundary region outside the pixel region, the pixel region comprising an area having a short dimension and a long dimension, the pixel region comprising an array of pixels to emit light, the OLED display device comprising:
a substrate in the pixel region and in the boundary region;
an electrode on the substrate in the pixel region, the electrode having long edge portions oriented along the long dimension of the pixel region and the electrode having short edge portions oriented along the short dimension of the pixel region;
a first bank on the substrate in the boundary region and on the long and the short edge portions of the electrode in the pixel region;
a second bank on the first bank in the boundary region, the second bank having long edge portions oriented along the long dimension of the pixel region and short edge portions oriented along the short dimension of the pixel region;
an organic light emitting layer on the electrode and on the first bank in the pixel region and on at least a portion of the second bank in the boundary region, wherein an average height of short edge portions of the organic light emitting layer on the second bank is greater than an average height of long edge portions of the organic light emitting layer on the second bank.

13. The OLED display device of claim 12, wherein a width of short edge portions of the organic light emitting layer over the first bank along the short dimension is different than a width of long edge portions of the organic light emitting layer over the first bank along the long dimension.

14. The OLED display device of claim 13, wherein the width of the short edge portions of the organic light emitting layer over the first bank along the short dimension is greater than the width of the long edge portions of the organic light emitting layer over the first bank along the long dimension.

15. The OLED display device of claim 12, wherein widths of short edge portions of the first bank on the short edge portions of the electrode are greater than widths of long edge portions of the first bank on the short edge portions of the electrode.

16. The OLED display device of claim 15, wherein the widths of the short edge portions of the first bank are in a range of approximately 1.5-2 times the widths of the long edge portions of the first bank.

17. The OLED display device of claim 12, wherein heights of the short edge portions of the second bank are greater than heights of the long edge portions of the second bank.

18. The OLED display device of claim 17, wherein the heights of the short edge portions of the second bank are in a range of approximately 1.25-2 times the heights of the long edge portions of the second bank.

19. The OLED display device of claim 17, wherein the heights of the short edge portions of the second bank are in a range of about 3 um or less and are at least 0.5 um greater than the heights of the long edge portions of the second bank.

20. The OLED display device of claim 12, wherein the first bank comprises a hydrophilic inorganic material, and the second bank comprises a hydrophobic organic material.

21. The OLED display device of claim 12, wherein widths of short edge portions of the first bank on the short edge portions of the electrode and widths of long edge portions of the first bank on the long edge portions of the electrode are dimensioned such that the average height of the short edge portions of the organic light emitting layer on the second bank is greater than the average height of the long edge portions of the organic light emitting layer on the second bank.

22. The OLED display device of claim 12, wherein heights of the short edge portions of the second bank and heights of the long edge portions of the second bank are dimensioned such that the average height of the short edge portions of the organic light emitting layer on the second bank is greater than the average height of the long edge portions of the organic light emitting layer on the second bank.

* * * * *